United States Patent
Sridharan et al.

(10) Patent No.: US 11,743,026 B2
(45) Date of Patent: Aug. 29, 2023

(54) PHASE-ALIGNING MULTIPLE SYNTHESIZERS

(71) Applicant: Anokiwave, Inc., San Diego, CA (US)

(72) Inventors: Kartik Sridharan, San Diego, CA (US); Jun Li, San Diego, CA (US); Gaurav Menon, San Marcos, CA (US); Shamsun Nahar, San Diego, CA (US); Akhil Garlapati, San Diego, CA (US); Scott Humphreys, Greensboro, NC (US); Antonio Geremia, San Diego, CA (US)

(73) Assignee: Anokiwave, Inc., San Diego, CA (US)

( * ) Notice: Subject to any disclaimer, the term of this patent is extended or adjusted under 35 U.S.C. 154(b) by 0 days.

(21) Appl. No.: 17/682,700

(22) Filed: Feb. 28, 2022

(65) Prior Publication Data

US 2022/0303112 A1      Sep. 22, 2022

Related U.S. Application Data

(63) Continuation of application No. 16/932,187, filed on Jul. 17, 2020, now Pat. No. 11,296,860.

(60) Provisional application No. 62/875,984, filed on Jul. 19, 2019.

(51) Int. Cl.
   *H03D 3/24*       (2006.01)
   *H04L 7/033*      (2006.01)
   *H04L 7/027*      (2006.01)
   *H03L 7/18*       (2006.01)

(52) U.S. Cl.
   CPC .............. *H04L 7/0331* (2013.01); *H03L 7/18* (2013.01); *H04L 7/0276* (2013.01); *H04L 7/0337* (2013.01)

(58) Field of Classification Search
   CPC ... H04L 7/0331; H04L 7/0276; H04L 7/0337; H04L 7/033; H03L 7/18; H03L 7/089; H03L 7/0891; H03L 7/235
   USPC ................................. 375/376, 373–375, 327
   See application file for complete search history.

(56) References Cited

U.S. PATENT DOCUMENTS

| | | | |
|---|---|---|---|
| 9,225,507 B1 * | 12/2015 | Lye | H03L 7/235 |
| 10,116,315 B1 * | 10/2018 | Zhuang | H04L 7/033 |
| 11,296,860 B2 * | 4/2022 | Sridharan | H04L 7/0337 |

(Continued)

*Primary Examiner* — Phuong Phu
(74) *Attorney, Agent, or Firm* — Nutter McClennen & Fish LLP

(57) ABSTRACT

Embodiments of the present invention synchronize multiple synthesizers, such as phase-locked loops (PLLs), in a manner that does not require communication or coordination between the synthesizers. Specifically, each synthesizer is part of a synthesizer circuit that includes a synthesizer (e.g., a PLL), a phase measurement circuit, and a synchronization circuit. A common reference signal (e.g., an alternating clock signal) is provided to the synthesizer circuits. In one exemplary embodiment, in each synthesizer circuit, the phase measurement circuit measures a phase difference between the reference signal and a corresponding output of the synthesizer, and the synchronization circuit adjusts the synthesizer operation based on the measured phase difference in such a way that all of the synthesizers operate in-phase with one another relative to the common reference signal, without having any communication or coordination between the two synthesizer circuits other than provision of the common reference signal.

33 Claims, 5 Drawing Sheets

(56) References Cited

U.S. PATENT DOCUMENTS

2012/0076180 A1* 3/2012 Hoshino ................ H03L 7/089
                                                    327/157
2017/0324419 A1* 11/2017 Mayer ................... H03L 7/0891

* cited by examiner

PHASE-ALIGNING MULTIPLE SYNTHESIZERS

CROSS-REFERENCE TO RELATED APPLICATION(S)

This patent application is a continuation of U.S. patent application Ser. No. 16/932,187 entitled PHASE-ALIGNING MULTIPLE SYNTHESIZERS filed Jul. 17, 2020, which claims the benefit of U.S. Provisional Patent Application No. 62/875,984 entitled PHASE-ALIGNING MULTIPLE SYNTHESIZERS filed Jul. 19, 2019, each of which is hereby incorporated herein by reference in its entirety.

FIELD OF THE INVENTION

The invention generally relates to phase-aligning multiple synthesizers such as phased-locked loops.

BACKGROUND OF THE INVENTION

Many electronic systems, such as 5G systems and radar systems, require multiple synthesizers such as phase-locked loops (PLLs) to be phase-aligned. One traditional method for phase-aligning multiple synthesizers is to simply start or reset the synthesizers at the same time, e.g., based on a synchronization signal. However, the initial accuracy in this method is poor and, over time, the synthesizers can drift due to various sources of errors. Another traditional method for phase-aligning multiple synthesizers is to utilize circuitry to synchronize the synthesizer outputs, e.g., using one as a reference and adding delay to one or more of the synthesizer outputs, e.g., using a delay line. Among other things, this type of solution can have issues of power consumption and noise.

SUMMARY OF VARIOUS EMBODIMENTS

In accordance with one embodiment of the invention, a synthesizer system comprises a plurality of synthesizer circuits and a common reference signal provided to each of the plurality of synthesizer circuits, where each synthesizer circuit comprises a synthesizer having an input coupled to the common reference signal and an output; a phase measurement circuit having a first input coupled to the common reference signal, a second input coupled to the output of the synthesizer, and an output for providing one or more measurement values, each measurement value representing a phase difference between the common reference signal on the first input and the synthesizer output on the second input; and a synchronization circuit configured to phase-adjust operation of the synthesizer based on the one or more measurement values.

In various alternative embodiments, the phase measurement circuit may include a time-to-digital converter. The synthesizer may include a phase-locked loop, in which case the synchronization circuit may include a delta sigma modulator of the phase-locked loop. Additionally or alternatively, the synchronization circuit may include a delay circuit such as delay lines.

Embodiments also may include a controller configured to determine a phase adjustment value for a given synthesizer circuit based on one or more measurement values from the given synthesizer circuit. The controller may be part of the given synthesizer circuit or may be external to the given synthesizer circuit. The phase adjustment value may be a negative time value or a phase offset. The phase adjustment value may be based on a plurality of measurement values such as an average of the plurality of measurement values.

Additional embodiments may be disclosed and claimed.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

It should be noted that the foregoing figures and the elements depicted therein are not necessarily drawn to consistent scale or to any scale. Unless the context otherwise suggests, like elements are indicated by like numerals.

DESCRIPTION OF ILLUSTRATIVE EMBODIMENTS

Figure 1:
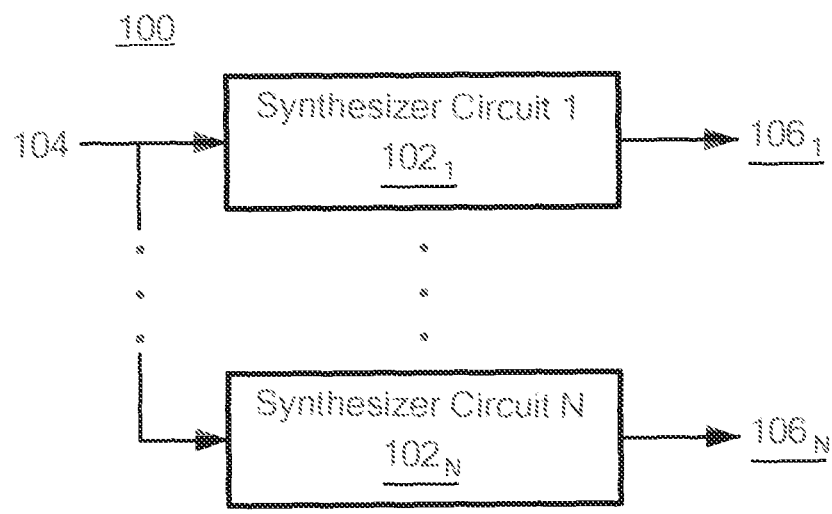
FIG. 1 is a schematic diagram of a synthesizer system in accordance with one exemplary embodiment.

Embodiments of the present invention synchronize multiple synthesizers, such as phase-locked loops (PLLs), in a manner that does not require communication or coordination between the synthesizers. Specifically, each synthesizer is part of a synthesizer circuit that includes a synthesizer (e.g., a PLL), a phase measurement circuit, and a synchronization circuit. A common reference signal (e.g., an alternating clock signal) is provided to the synthesizer circuits. In one exemplary embodiment, in each synthesizer circuit, the phase measurement circuit measures a phase difference between the reference signal and a corresponding output of the synthesizer, and the synchronization circuit adjusts the synthesizer operation based on the measured phase difference in such a way that all of the synthesizers operate in-phase with one another relative to the common reference signal, without having any communication or coordination between the two synthesizer circuits other than provision of the common reference signal. Exemplary embodiments effectively bypass the types of issues discussed in the background section above and generally makes the rest of the system design easier as it effectively removes stringent part-to-part matching.

In certain exemplary embodiments, the phase measurement circuit includes a time-to-digital converter (TDC) having two inputs, one connected to the reference signal (e.g., a common clock input) and the other connected to the synthesizer output (e.g., a clock output). A first event, such as a rising edge of the reference signal, starts the counter. A second event, such as a subsequent rising edge of the synthesizer output, stops the counter. The TDC outputs a digital value representing the time difference between the two events. It should be noted that various alternative embodiments may utilize other types of phase measurement circuits, e.g., to measure a time difference or a phase difference between the reference signal and the synthesizer output signal. In many cases, time and phase can be used interchangeably, e.g., measuring a time difference and determining therefrom a phase difference, or measuring a phase difference and determining therefrom a time difference. In any case, the time or phase difference then can be used to adjust the operation of the synthesizer as discussed in greater detail below.

In certain exemplary embodiments, in each synthesizer circuit, the measured time difference is essentially used to introduce a negative time delay to the synthesizer. For example, if the measured time of a first synthesizer circuit is 1 microsecond and the measured time of a second synthesizer circuit is 2 microseconds, then the operation of the first synthesizer circuit can be advanced by 1 microsecond (i.e., in essence, a delay of −1 microsecond can be added) and the operation of the second synthesizer circuit can be advanced by 2 microseconds (i.e., in essence, a delay of −2 microseconds can be added) so that both synthesizer circuits end up operating in-phase with one another without having any communication or coordination between the two synthesizer circuits.

Similarly, measured or calculated phase offsets can be used to adjust the phases of the synthesizers. For example, if the measured or calculated phase offset of a first synthesizer circuit is 15 degrees and the measured or calculated phase offset of a second synthesizer circuit is 50 degrees, then a phase adjustment of −15 degrees can be used in the first synthesizer circuit and a phase adjustment of −50 degrees can be used in the second synthesizer circuit so that both synthesizer circuits end up operating in phase with one another without having any communication or coordination between the two synthesizer circuits.

In certain exemplary embodiments, the synchronization circuit can adjust the phase of the synthesizer using the existing delta sigma modulator of a phase-locked loop circuit. In this case, the measured time or phase differences may correlate with phase offsets that can be used to perform the phase adjustments. It should be noted that various alternative embodiments may utilize other types of phase adjustment circuits, e.g., delay lines.

As the phase performance of each synthesizer may change or drift over time due to any of various factors, the measurement and adjustment process can be performed in a number of successive measurement/adjustment cycles in order to pull the synthesizers back into synchronization from time to time. For example, an external control circuit can provide a signal to the synthesizer circuits to run a measurement/adjustment cycle, and the control circuit can provide such a signal from time to time in order to run successive measurement/adjustment cycles.

Additionally or alternatively, during each of one or more measurement/adjustment cycles, N time or phase measurements may be made (e.g., one per reference clock period for N successive reference clock periods), with the resulting N time or phase measurements used (e.g., averaged) to provide a final adjustment value for the measurement/adjustment cycle.

It should be noted that, because each synthesizer circuit is independently measured and adjusted, any number of synthesizer circuits can be included in a synthesizer system.

Furthermore, in certain exemplary embodiments, each synthesizer may be run at a multiple of the common reference signal frequency f (e.g., N×f, where N can be an integer or can be fractional in different embodiments), and the techniques described herein can be used to synchronize synthesizers running at the same multiple or at different multiples of the reference signal.

Generally speaking, embodiments include additional control circuitry that utilizes the one or more measurements from a phase measurement circuit to determine and implement the phase adjustment for the corresponding synthesizer such as by providing a phase adjustment value to the synchronization circuit of the synthesizer circuit. Each synthesizer circuit can include its own control circuitry, or the control circuitry can be outside of the synthesizer circuits, e.g., an external controller that can read measurements from each synthesizer circuit and write phase adjustment values back to each synthesizer circuit such as through a memory or register set accessible over a bus or other communication interface.

FIG. 1 is a schematic diagram of a synthesizer system 100 in accordance with one exemplary embodiment. The synthesizer system 100 includes N synthesizer circuits 102 labeled here 1 through N, with each synthesizer circuit 102 producing an output signal 106 based on common reference signal 104. It should be noted that, in various alternative embodiments, the output signals 106 may be provided to other circuitry of a larger device or may be used exclusively within the synthesizer circuit for the time measurement.

Figure 2:
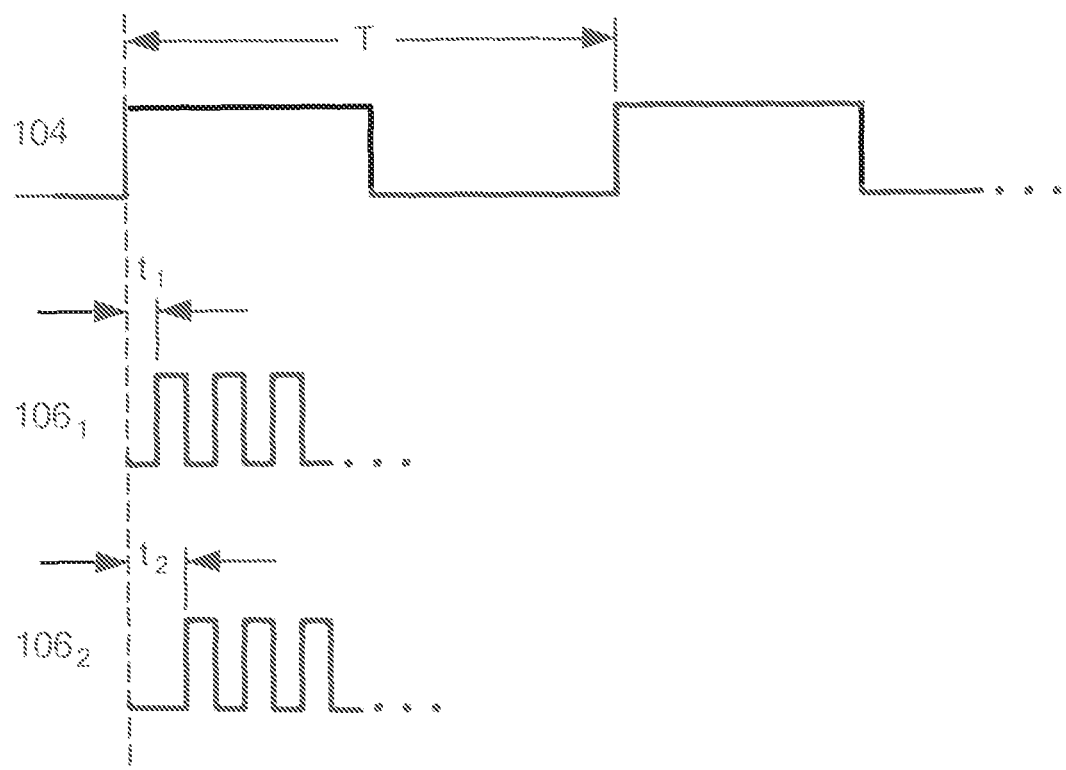
FIG. 2 is a schematic diagram showing an exemplary timing diagram to demonstrate operation of the synthesizer system, in accordance with one exemplary embodiment.

FIG. 2 is a schematic diagram showing an exemplary timing diagram to demonstrate operation of the synthesizer system, in accordance with one exemplary embodiment. Here, two synthesizers are being synchronized relative to the common reference signal 104 have a time period T. Synthesizer circuit 1 measures a time delay t1 between the rising edge of the reference signal 104 and next rising edge of the synthesizer 1 output. Synthesizer circuit 2 measures a time delay t2 between the rising edge of the reference signal 104 and the next rising edge of the synthesizer 2 output. In one exemplary embodiment, synthesizer 1 can be adjusted by a negative time factor −t1, while synthesizer 2 can be adjusted by a negative time factor −t2, thereby bringing the two synthesizers into phase with one another. In another exemplary embodiment, synthesizer 1 can be adjusted by a positive time factor (T−t1), while synthesizer 2 can be adjusted by a positive time factor (T−t2), thereby bringing the two synthesizers into phase with one another.

Figure 3:
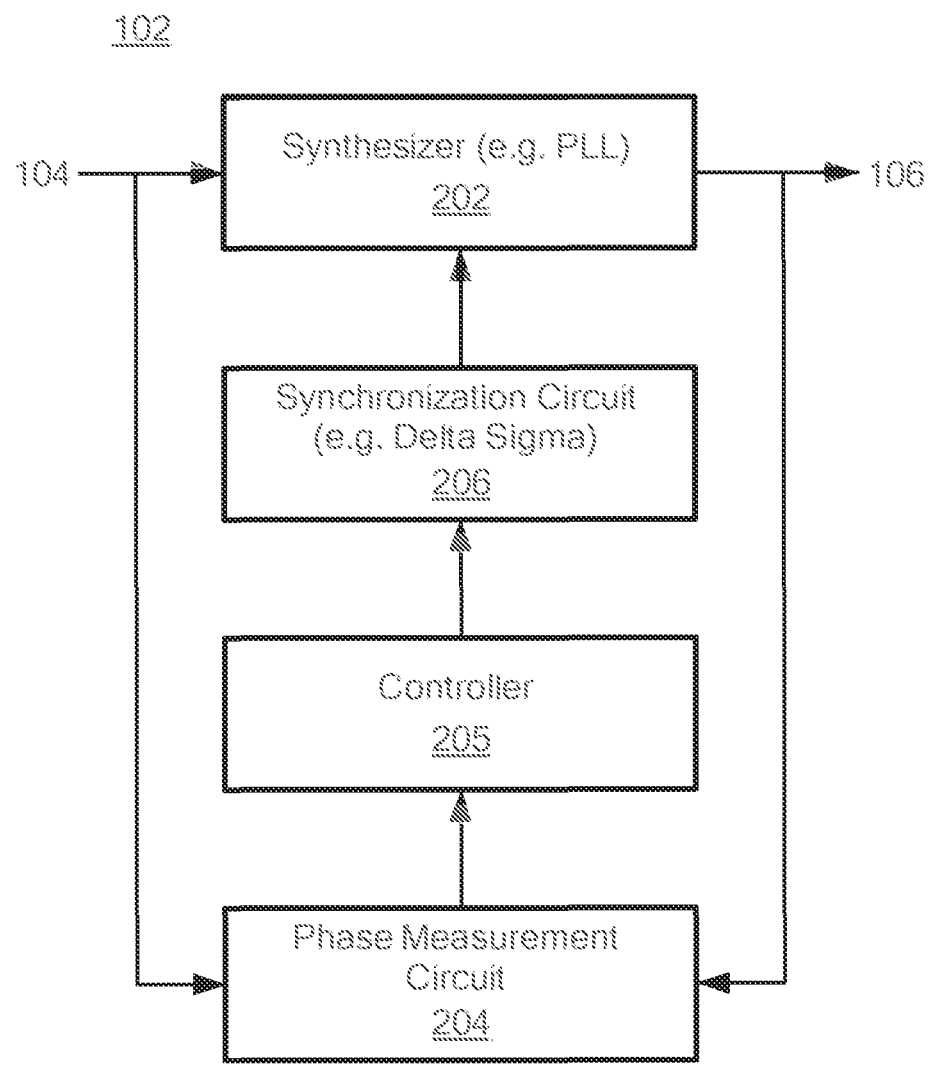
FIG. 3 is a schematic diagram of a synthesizer circuit in accordance with one exemplary embodiment.

FIG. 3 is a schematic diagram of a synthesizer circuit 102 in accordance with one exemplary embodiment. Here, the synthesizer circuit 102 includes a synthesizer (e.g., a PLL) 202, a phase measurement circuit 204 (e.g., a TDC), and a synchronization circuit 206 (e.g., the delta sigma modulator of a fractional PLL). The common reference signal 104 is provided as a first input to the synthesizer 202 and to the phase measurement circuit 204. The synthesizer output signal 106 is provide as a second input to the phase measurement circuit 204. The phase measurement circuit 204 makes one or more measurements of phase differences between the reference signal 104 and the synthesizer output signal 106 and provides one or more corresponding measurement values to an internal or external controller 205. The controller 205 determines a phase adjustment value based on the one or more measurement values from the phase measurement circuit 204 and provides the phase adjustment value to the synchronization circuit 206, which in turn uses the phase adjustment value to adjust the synthesizer 202 operation in such a way that the synthesizer 202 operates in-phase with one or more other synthesizer circuits relative to the common reference signal, without having any communication or coordination between the synthesizer circuits other than provision of the common reference signal. For example, the synchronization circuit 206 may comprise the existing delta sigma modulator of a PLL and therefore may be considered part of the synthesizer itself. In some embodiments, the synchronization circuit 206 can be part of the controller 205.

Figure 4:
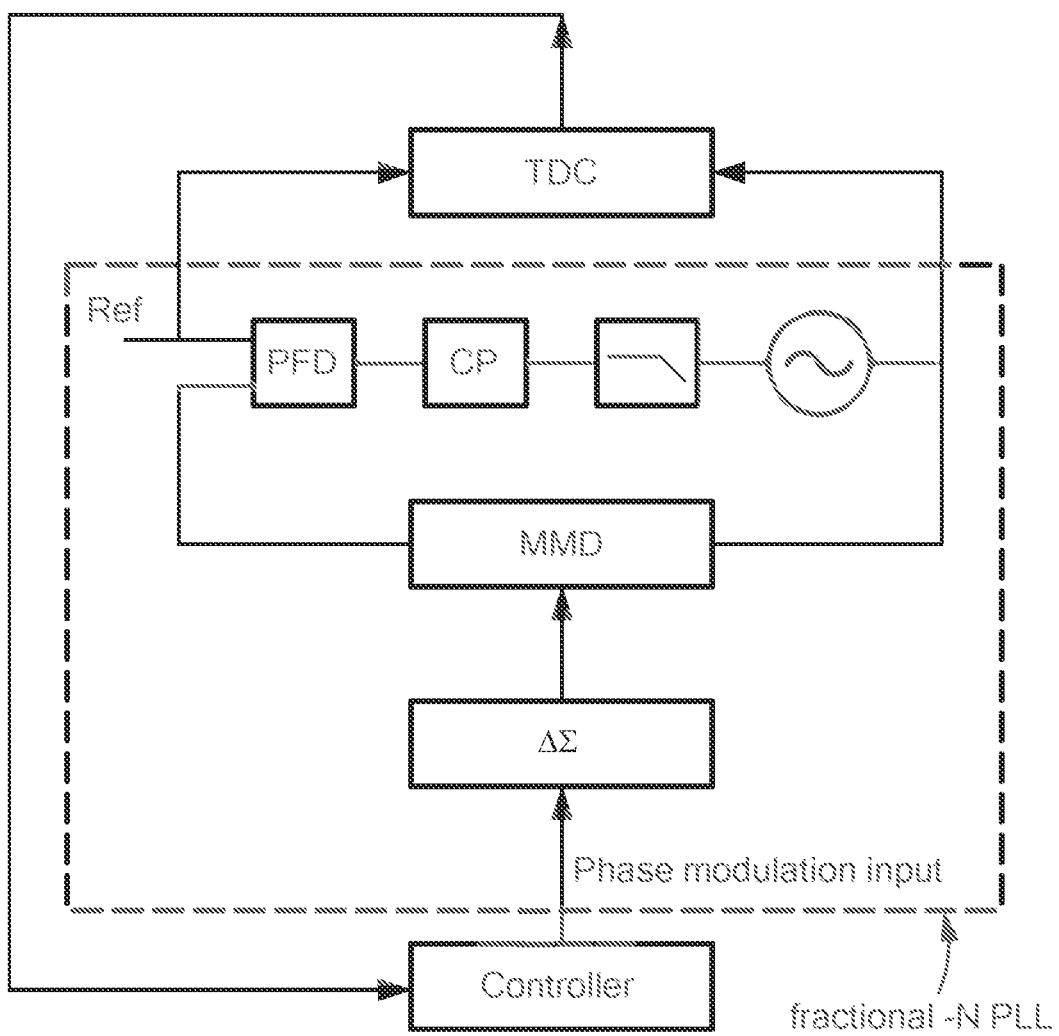
FIG. 4 is a schematic diagram showing details of a specific synthesizer circuit, in accordance with one exemplary embodiment.

FIG. 4 is a schematic diagram showing details of a specific synthesizer circuit, in accordance with one exemplary embodiment. Here, the synthesizer circuit includes a synthesizer in the form of a fractional-N delta sigma phase-locked loop (PLL) and a phase measurement circuit in the form of a time-to-digital (TDC) converter. The synchronization circuit here includes the existing delta sigma modulator and multiple modulus divider of the PLL, which are used to adjust the phase operation of the PLL based on the phase modulation input from the controller. As discussed above, the TDC has two inputs, one input coupled to the common reference signal and the other input coupled to the PLL output signal. At various times, the TDC measures the time difference between the reference signal and the PLL output signal and provides one or more time measurements, which can be stored in a digital register and/or provided to an internal or external controller, e.g., via a bus interface. The controller uses the time measurement(s) to determine a synthesizer adjustment value, which, in this example is a phase modulation adjustment (e.g., a negative time adjustment) that is fed into the existing delta sigma in the PLL as a phase modulator input for adjusting the operation of the PLL to align the phase of the PLL to the phase of the common reference signal, although in other exemplary embodiments, the phase modulation adjustment can be provided to any phase modulation port of the synthesizer. Thus, exemplary embodiments provide a low-cost way to measure and align the phase of multiple PLLs, particularly where the existing delta sigma in the PLL is used as the phase modulator to adjust the phase.

Figure 5:
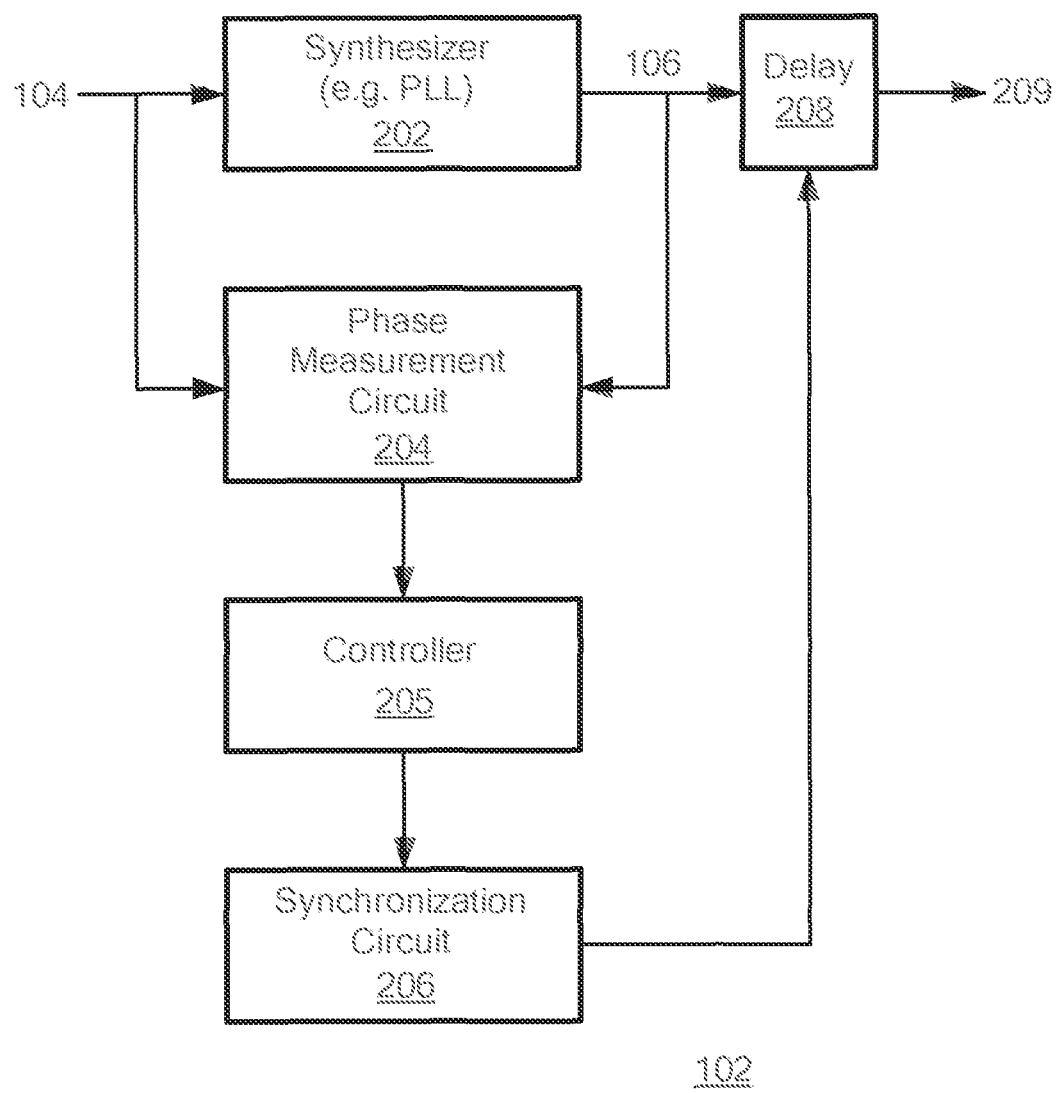
FIG. 5 is a schematic diagram of a synthesizer circuit in accordance with another exemplary embodiment.

FIG. 5 is a schematic diagram of a synthesizer circuit 102 in accordance with another exemplary embodiment. Here, the synthesizer circuit 102 includes a synthesizer (e.g., a PLL) 202, a phase measurement circuit 204 (e.g., a TDC), and a synchronization circuit 206. The common reference signal 104 is provided as a first input to the synthesizer 202 and to the phase measurement circuit 204. The synthesizer output signal 106 is provide as a second input to the phase measurement circuit 204. The phase measurement circuit 204 makes one or more measurements of phase differences between the reference signal 104 and the synthesizer output signal 106 and provides one or more corresponding measurement values to an internal or external controller 205. The controller 205 determines a phase adjustment value based on the one or more measurement values from the phase measurement circuit 204 and provides the phase adjustment value to the synchronization circuit 206, which in turn uses the phase adjustment value to control a delay circuit 208 to produce the final synthesizer output signal 209 in such a way that the final synthesizer output signal 209 is in-phase with one or more other synthesizer circuits relative to the common reference signal, without having any communication or coordination between the synthesizer circuits other than provision of the common reference signal. The delay circuit can comprise delay lines, a programmable delay time, a digitally programmable delay generator, or other delay circuit. In this embodiment, the delay circuit 208 is considered to be part of the synchronization circuit 206. In some embodiments, the synchronization circuit 206 can be part of the controller 205.

In any of the described embodiments, the controller 205 may control such things as when the phase measurement circuit 204 makes measurements and when the synchronization circuit 206 adjusts the operation of the synthesizer 202. For example, the controller 205 may control the phase measurement circuit 204 by directly or indirectly providing an "enable" signal to the phase measurement circuit.

Figure 6:
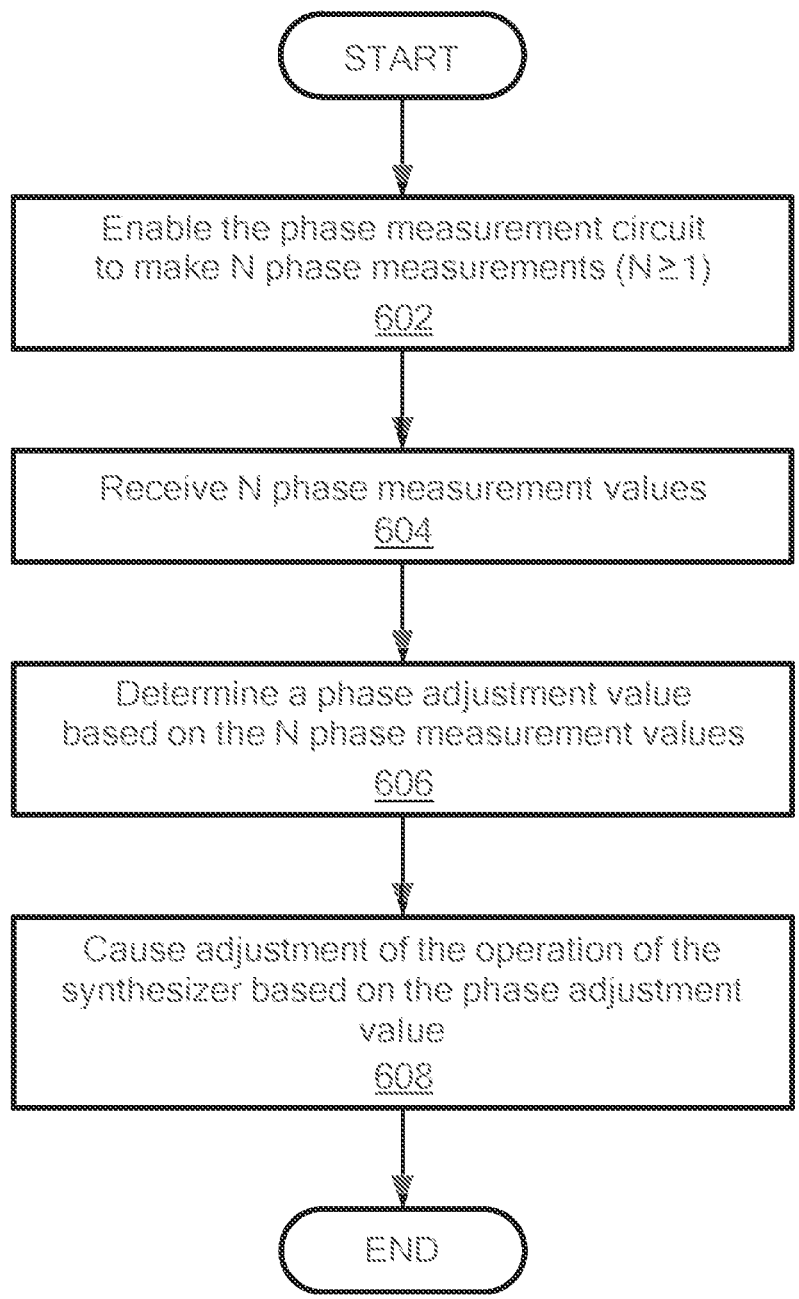
FIG. 6 is a logic flow diagram for operation of the controller, in accordance with one exemplary embodiment.

FIG. 6 is a logic flow diagram for operation of the controller, in accordance with one exemplary embodiment. Here, the controller optionally enables the phase measurement circuit to make N phase measurements (N greater than or equal to one), in block 602. Alternatively, the phase measurement circuit may make measurements on an ongoing basis and output measurement values that are accessible to the controller. In any case, the controller receives N phase measurement values from the phase measurement circuit, in block 604. The controller then determines a phase adjustment value based on the N phase measurement values, in block 606. For example, the controller may average the N phase measurement values. Then, in block 608, the controller causes adjustment of the operation of the synthesizer based on the phase adjustment value.

It should be noted that embodiments of the present invention can be broadly applied wherever phase synchronization is needed, e.g., 5G and radar systems. Additionally, exemplary embodiments can be used to accurately remove systematic phase offsets (for example in PCB) and provide accurate phase correction to arbitrary precision.

Control logic, such as for processing phase measurements and controlling the phase adjustments of the synthesizers, may be implemented at least in part in any conventional computer programming language. For example, some embodiments may be implemented in a procedural programming language (e.g., "C"), or in an object-oriented programming language (e.g., "C++"). Other embodiments of the invention may be implemented as a pre-configured, stand-along hardware element and/or as preprogrammed hardware elements (e.g., application specific integrated circuits, FPGAs, and digital signal processors), or other related components.

In an alternative embodiment, the disclosed apparatus and methods (e.g., see the various flow charts described above) may be implemented as a computer program product for use with a computer system. Such implementation may include a series of computer instructions fixed either on a tangible, non-transitory medium, such as a computer readable medium (e.g., a diskette, CD-ROM, ROM, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software.

Computer program logic implementing all or part of the functionality previously described herein may be executed at different times on a single processor (e.g., concurrently) or may be executed at the same or different times on multiple processors and may run under a single operating system process/thread or under different operating system processes/threads. Thus, the term "computer process" refers generally to the execution of a set of computer program instructions regardless of whether different computer processes are executed on the same or different processors and regardless of whether different computer processes run under the same operating system process/thread or different operating system processes/threads.

Importantly, it should be noted that embodiments of the present invention may employ conventional components such as conventional computers (e.g., off-the-shelf PCs, mainframes, microprocessors), conventional programmable logic devices (e.g., off-the shelf FPGAs or PLDs), or conventional hardware components (e.g., off-the-shelf ASICs or discrete hardware components) which, when programmed or configured to perform the non-conventional methods described herein, produce non-conventional devices or systems. Thus, there is nothing conventional about the inventions described herein because even when embodiments are implemented using conventional components, the resulting devices and systems are necessarily non-conventional because, absent special programming or configuration, the conventional components do not inherently perform the described non-conventional functions.

The activities described and claimed herein provide technological solutions to problems that arise squarely in the realm of technology. These solutions as a whole are not well-understood, routine, or conventional and in any case provide practical applications that transform and improve computers and computer routing systems.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Various inventive concepts may be embodied as one or more methods, of which examples have been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

Although the above discussion discloses various exemplary embodiments of the invention, it should be apparent that those skilled in the art can make various modifications that will achieve some of the advantages of the invention without departing from the true scope of the invention. Any references to the "invention" are intended to refer to exemplary embodiments of the invention and should not be construed to refer to all embodiments of the invention unless the context otherwise requires. The described embodiments are to be considered in all respects only as illustrative and not restrictive.

What is claimed is:

1. A synthesizer system comprising:
    a plurality of synthesizer circuits coupled to receive a common reference signal and a common control signal to initiate a number of synthesizer measurement/adjustment cycles including at least one of an initial synchronization or a subsequent resynchronization, each synthesizer circuit comprising:
        a synthesizer having a synthesizer input coupled to receive the common reference signal and a synthesizer output derived from the common reference signal;
        a measurement circuit having a first input coupled to receive the common reference signal, a second input coupled to receive the synthesizer output, and a measurement output for providing one or more measurement values; and
    a synchronization circuit coupled to the synthesizer and coupled to receive the measurement output,
    wherein, in each synthesizer measurement/adjustment cycle initiated by the common control signal:
        the measurement circuit is configured to provide one or more measurement values for the cycle in response to the common control signal, each measurement value representing a time or phase difference between the common reference signal on the first input and the synthesizer output on the second input; and
        the synchronization circuit is configured to phase-adjust operation of the synthesizer independently of the other synthesizers in response to the common control signal based on the one or more measurement values for the cycle to phase-align the synthesizer output with the other synthesizer outputs based on the common reference signal received by the plurality of synthesizer circuits without any coordination between the synchronization circuits.

2. A system according to claim 1, wherein the measurement circuit comprises a time-to-digital converter.

3. A system according to claim 1, wherein the synthesizer comprises a phase-locked loop.

4. A system according to claim 3, wherein the synchronization circuit comprises a delta sigma modulator of the phase-locked loop.

5. A system according to claim 1, wherein the synchronization circuit comprises a delay circuit.

6. A system according to claim 5, wherein the delay circuit comprises delay lines.

7. A system according to claim 1, further comprising:
    a controller configured to determine a phase adjustment value for a given synthesizer circuit based on one or more measurement values from the given synthesizer circuit.

8. A system according to claim 7, wherein the controller is part of the given synthesizer circuit.

9. A system according to claim 7, wherein the controller is external to the given synthesizer circuit.

10. A system according to claim 7, wherein the phase adjustment value comprises a negative time value.

11. A system according to claim 7, wherein the phase adjustment value comprises a phase offset.

12. A system according to claim 7, wherein the phase adjustment value is based on a plurality of measurement values.

13. A system according to claim 12, wherein the phase adjustment value comprises an average of the plurality of measurement values.

14. A system according to claim 7, wherein the controller is configured to provide the phase adjustment value to a phase modulation port of the synthesizer.

15. A system according to claim 1, wherein the common reference signal is an alternating clock signal.

16. A system according to claim 1, further comprising:
    a circuit configured to provide the common reference signal.

17. A method of phase aligning multiple synthesizers, the method comprising:
    providing a common reference signal and a common control signal to each of a plurality of synthesizers, the common control signal initiating a number of synthesizer measurement/adjustment cycles including at least one of an initial synchronization or a subsequent resynchronization; and
    for each synthesizer measurement/adjustment cycle initiated by the common control signal:
        providing, by each synthesizer, one or more measurement values for the cycle, each measurement value representing a time or phase difference between the common reference signal and a synthesizer output derived from the common reference signal; and
        phase-adjusting, by each synthesizer independently of the other synthesizers, operation of the synthesizer based on the one or more measurement values for the cycle to phase-align the synthesizer output with the other synthesizer outputs based on the common reference signal received by the plurality of synthesizer circuits without any coordination between the synchronization circuits.

18. A method according to claim 17, wherein phase-adjusting operation of the synthesizer based on the one or more measurement values comprises:
    determining a phase adjustment value for the synthesizer based on one or more measurement values from the synthesizer.

19. A method according to claim 18, wherein the phase adjustment value is one of (a) a negative time value or (b) a phase offset.

20. A system according to claim 1, further comprising:
a controller configured to provide the common control signal to initiate the number of measurement/adjustment cycles.

21. A synthesizer circuit for a synthesizer system having a plurality of synthesizer circuits, each of the synthesizer circuits structurally the same as the synthesizer circuit for the synthesizer system, the synthesizer circuit comprising:
a reference input for receiving a common reference signal that is provided to the plurality of synthesizer circuits;
a control input for receiving a common control signal that is provided to the plurality of synthesizer circuits to initiate a number of synthesizer measurement/adjustment cycles including at least one of an initial synchronization or a subsequent resynchronization;
a synthesizer having a synthesizer input coupled to receive the common reference signal and a synthesizer output having a phase and frequency derived from the common reference signal;
a measurement circuit having a first input coupled to receive the common reference signal, a second input coupled to receive the synthesizer output, and a measurement output for providing one or more measurement values; and
a synchronization circuit coupled to the synthesizer and coupled to receive the measurement output,
wherein, in each synthesizer measurement/adjustment cycle initiated by the common control signal:
the measurement circuit is configured to provide one or more measurement values for the cycle in response to the common control signal, each measurement value representing a time or phase difference between the common reference signal on the first input and the synthesizer output on the second input; and
the synchronization circuit is configured to phase-adjust operation of the synthesizer independently of the other synthesizers in response to the common control signal based on the one or more measurement values for the cycle to phase-align the synthesizer output with the other synthesizer outputs based on the common reference signal received by the plurality of synthesizer circuits without any coordination between the synchronization circuits.

22. A synthesizer circuit according to claim 21, wherein the measurement circuit comprises a time-to-digital converter.

23. A synthesizer circuit according to claim 21, wherein the synthesizer comprises a phase-locked loop.

24. A synthesizer circuit according to claim 23, wherein the synchronization circuit comprises a delta sigma modulator of the phase-locked loop.

25. A synthesizer circuit according to claim 21, wherein the synchronization circuit comprises a delay circuit.

26. A synthesizer circuit according to claim 25, wherein the delay circuit comprises delay lines.

27. A synthesizer circuit according to claim 21, further comprising:
a controller configured to determine a phase adjustment value for the synthesizer circuit based on one or more measurement values from the synthesizer circuit.

28. A synthesizer circuit according to claim 27, wherein the phase adjustment value comprises a negative time value.

29. A synthesizer circuit according to claim 27, wherein the phase adjustment value comprises a phase offset.

30. A synthesizer circuit according to claim 27, wherein the phase adjustment value is based on a plurality of measurement values.

31. A synthesizer circuit according to claim 30, wherein the phase adjustment value comprises an average of the plurality of measurement values.

32. A synthesizer circuit according to claim 27, wherein the controller is configured to provide the phase adjustment value to a phase modulation port of the synthesizer.

33. A synthesizer circuit according to claim 21, wherein the common reference signal is an alternating clock signal.

* * * * *